United States Patent
Wendler et al.

(10) Patent No.: US 12,253,554 B2
(45) Date of Patent: Mar. 18, 2025

(54) SIGNAL PROCESSING CIRCUIT AND MEASUREMENT INSTRUMENT

(71) Applicant: Rohde & Schwarz GmbH & Co. KG, Munich (DE)

(72) Inventors: Wolfgang Wendler, Munich (DE); Gregor Feldhaus, Munich (DE); Florian Ramian, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 18/178,051

(22) Filed: Mar. 3, 2023

(65) Prior Publication Data

US 2024/0019477 A1    Jan. 18, 2024

(30) Foreign Application Priority Data

Jul. 18, 2022 (EP) .................................... 22185484

(51) Int. Cl.
*G01R 29/26* (2006.01)
*G01R 35/00* (2006.01)

(52) U.S. Cl.
CPC ............. *G01R 29/26* (2013.01); *G01R 35/00* (2013.01)

(58) Field of Classification Search
CPC .................................................... G01R 29/26
See application file for complete search history.

(56) References Cited

U.S. PATENT DOCUMENTS

| | | |
|---|---|---|
| 6,977,600 B2 | 12/2005 | Jiang et al. |
| 10,280,069 B2 | 5/2019 | Gilbert et al. |
| 10,756,829 B1 | 8/2020 | Therrien |
| 10,761,134 B2 | 9/2020 | Lagler et al. |
| 11,112,447 B1 * | 9/2021 | Martens .................. G06F 17/13 |
| 11,255,892 B2 | 2/2022 | Drawing |

(Continued)

FOREIGN PATENT DOCUMENTS

| | | |
|---|---|---|
| CN | 1658509 A | 8/2005 |
| CN | 104980388 A | 10/2015 |

(Continued)

OTHER PUBLICATIONS

Lepek, A. and F.L. Walls, "Cross Correlation Analysis Improves Time Domain Measurements," 1993 IEEE International Frequency Control Symposium; Downloaded Feb. 21, 2022; pp. 312-320.

(Continued)

*Primary Examiner* — Lee E Rodak
*Assistant Examiner* — Sangkyung Lee
(74) *Attorney, Agent, or Firm* — CHRISTENSEN O'CONNOR JOHNSON KINDNESS PLLC (57) ABSTRACT

A signal processing circuit for a measurement instrument is described. The signal processing circuit includes an analysis circuit, a measurement input, and at least two parallel measurement channels. The parallel measurement channels are configured to process the input signal, thereby generating first and second complex-valued measurement signals. The analysis circuit is configured to determine first and second error quantities associated with the first and second complex-valued measurement signals, respectively. The analysis circuit is configured to determine a complex-valued average signal corresponding to a combined average of the first and second complex-valued measurement signals. The analysis circuit is configured to determine a combined error quantity based on the complex-valued average signal. The analysis circuit is configured to determine a comparison quantity based on the combined error quantity as well as based on the first error quantity and/or the second error quantity.

13 Claims, 4 Drawing Sheets

(56) References Cited

U.S. PATENT DOCUMENTS

| | | | |
|---|---|---|---|
| 2005/0238094 A1 | 10/2005 | Bessho et al. | |
| 2007/0225927 A1 | 9/2007 | Bessho et al. | |
| 2008/0109179 A1 | 5/2008 | Tamba | |
| 2010/0156437 A1* | 6/2010 | Cobb | G01R 31/58 324/614 |
| 2015/0108971 A1* | 4/2015 | Granig | G01R 33/09 324/252 |
| 2022/0065972 A1* | 3/2022 | Chaudhary | G01R 35/005 |

FOREIGN PATENT DOCUMENTS

| | | |
|---|---|---|
| CN | 108710027 A | 10/2018 |
| CN | 110857954 A | 3/2020 |
| CN | 111103467 A | 5/2020 |
| EP | 3486666 A1 | 5/2019 |
| EP | 3936877 A1 | 1/2022 |

OTHER PUBLICATIONS

"Noise reduction by parallel cross-correlation measurements," Zurich Instruments; Application Note; May 2019; 4 pages.

Alink, M.S. et al., "Spectrum Sensing With High Sensitivity and Interferer Robustness Using Cross-Correlation Energy Detection," IEE Journal on Emerging and Selected Topics in Circuits and Systems; vol. 3, No. 4, Dec. 2013; pp. 566-575.

Rubiola, E. and F. Vernotte, "The cross-spectrum experimental method," femto-st; Feb. 27, 2010 <http://rubiola.org> pp. 1-40.

* cited by examiner

| Analysis mode | Operation |
|---|---|
| Sample | $y_{det} = x(0)$ |
| Minimum | $y_{det} = \min_{k=0 \text{ to } N-1} x(k)$ |
| Maximum | $y_{det} = \max_{k=0 \text{ to } N-1} x(k)$ |
| Average | $y_{det} = \frac{1}{N} \cdot \sum_{k=0}^{N-1} x(k)$ |
| RMS | $y_{det} = \sqrt{\frac{1}{N} \cdot \sum_{k=0}^{N-1} |x(k)|^2}$ |
| x-corr | $y_{det} = \sqrt{\frac{1}{N} \cdot \sum_{k=0}^{N-1} x_1(k) \cdot x_2^*(k)}$ |

SIGNAL PROCESSING CIRCUIT AND MEASUREMENT INSTRUMENT

FIELD OF THE DISCLOSURE

Embodiments of the present disclosure generally relate to a signal processing circuit for a measurement instrument. Embodiments of the present disclosure further relate to a measurement instrument.

BACKGROUND

In order to analyze the modulation quality of a device under test (DUT), measurement instruments usually determine error measures associated with an output signal of the DUT, for example an error vector magnitude (EVM). Beside other effects, the analysis of these error measures is limited by the signal-to-noise-ratio (S/N ratio) of the signal to be measured.

However, the measurement instrument cannot distinguish between noise that originates from the device under test (DUT) and noise added by the measurement instrument itself.

Accordingly, if the measurement instrument has an intrinsic noise level that is of the same magnitude or even higher than the noise level of the device under test, certain parameters like the EVM cannot be reliably measured.

For a user of a measurement instrument, it is hard to tell whether the noise in a measured signal is dominated by a noise contribution of the device under test or by noise originating from the measurement instrument.

Thus, there is a need for a signal processing circuit as well as a measurement instrument that provide additional information about the dominating origin of the noise.

SUMMARY

Embodiments of the present disclosure provide a signal processing circuit for a measurement instrument. In an embodiment, the signal processing circuit comprises an analysis circuit, a measurement input, and at least two parallel measurement channels. The at least two parallel measurement channels are each connected to the measurement input such that an input signal received via the measurement input is forwarded to the at least two parallel measurement channels. A first one of the two parallel measurement channels is configured to process the input signal, thereby generating a first complex-valued measurement signal. A second one of the two parallel measurement channels is configured to process the input signal, thereby generating a second complex-valued measurement signal.

In some embodiments, the analysis circuit is configured to: determine a first error quantity associated with the first complex-valued measurement signal; determine a second error quantity associated with the second complex-valued measurement signal; and determine a complex-valued average signal, wherein the complex-valued average signal corresponds to a combined average of the first complex-valued measurement signal and of a complex conjugate of the second complex-valued measurement signal. The analysis circuit is further configured to: determine a combined error quantity based on the complex-valued average signal; and determine a comparison quantity based on the combined error quantity as well as based on the first error quantity and/or the second error quantity. In some embodiments, the comparison quantity is indicative of a relative magnitude of the combined error quantity compared to the first error quantity and/or the second error quantity.

Therein, the first complex-valued measurement signal and the second complex-valued measurement signal both are associated with the same input signal received from a device under test.

In the context of the present disclosure, the term "error quantity" is understood to denote a parameter that is indicative of a deviation of the respective signal value from the corresponding ideal value, e.g. the one under ideal conditions which may also relate to a theoretical value neglecting noise.

For example, the term "error quantity" may denote an error vector describing the deviation of the amplitude and phase of the respective signal from the ideal amplitude and the ideal phase, respectively. As another example, the error quantity may denote a root mean square of several error vectors associated with the respective signal. However, it is to be understood that the error quantities may be any other suitable error measure.

The signal processing circuit according to embodiments of the present disclosure is based on the idea to determine a corresponding error quantity for the complex-valued average signal on one hand, and for the first complex-valued measurement signal and/or the second complex-values measurement signal on the other hand.

Both the first complex-valued measurement signal and the second complex-valued measurement signal comprise noise, namely phase noise and amplitude noise, originating from the device under test, such that these portions of the complex-valued measurement signals are correlated with each other and do not cancel out when performing the combined average.

On the other hand, noise originating in the parallel measurement channels processing the input signal in parallel is not correlated with each other and at least partially cancels out when performing the combined average.

Thus, by comparing the combined error quantity with the first error quantity and/or with the second error quantity, the amount of noise contributed by the measurement channels can be assessed in relation to the amount of noise contributed by the device under test.

Thus, the processing circuit according to embodiments of the present disclosure provides an easy to understand measure for whether the noise in the (processed) input signal is dominated by a noise contribution of the device under test or by noise originating in the measurement channels, namely the comparison quantity.

Accordingly, a user can conveniently assess whether a measured parameter, for example a measured error vector magnitude, is trustworthy, or in other words what the measurement uncertainty on the measured parameter is.

In some embodiments, the analysis circuit may be configured to determine the comparison quantity by comparing the combined error quantity with the first error quantity and/or with the second error quantity.

According to an aspect of the present disclosure, the comparison quantity is indicative of, for example, whether the combined error quantity differs from the first error quantity and/or the second error quantity by more or less than at least one predefined threshold value. In general, the combined error quantity is smaller than the first error quantity and the second error quantity, as noise originating in the parallel measurement channels cancels at least partially. Thus, if the noise contribution is dominated by the measurement channels, the combined error quantity will be significantly smaller than the first error quantity and/or the second error quantity.

Accordingly, if the combined error quantity differs from the first error quantity and/or the second error quantity by more than the at least one predefined threshold value, it may be concluded that the measurement channels contribute a significant or even dominant amount of noise such that a measured parameter, for example an EVM, is not the (correct) corresponding parameter of the device under test and is wrong.

On the other hand, if the combined error quantity differs from the first error quantity and/or the second error quantity by less than the at least one predefined threshold value, it may be concluded that the noise is dominated by the noise contribution of the device under test and the result is true.

In some embodiments, the at least one predefined threshold value may be between about 0.2 dB and about 5 dB, for example between about 0.5 dB and about 3 dB, for example between about 1 dB and about 2 dB.

In some embodiments, a plurality of threshold values may be provided. Accordingly, the comparison quantity may be indicative of whether the combined error quantity differs from the first error quantity and/or the second error quantity by more or less than one or several of the plurality of threshold values.

The plurality of threshold values may be associated with different categories of the relative magnitude of the combined error quantity compared to the first error quantity and/or the second error quantity. The categories may, for example, be "dominated by measurement channel noise", "similar magnitude of measurement channel noise and DUT noise", and "dominated by DUT noise".

In an embodiment of the present disclosure, the comparison quantity is value-discrete. In some embodiments, the comparison quantity may be binary, i.e., the comparison quantity may have one of two possible values. However, the comparison quantity may have more than two possible discrete values, e.g., three, four or five possible discrete values.

In some embodiments, the value of the comparison quantity may be determined based on the at least one predefined threshold value.

In some embodiments, the comparison quantity has a first value if the combined error quantity differs from the first error quantity and/or the second error quantity by more than the at least one predefined threshold value. The comparison quantity has a second value if the combined error quantity differs from the first error quantity and/or the second error quantity by less than the at least one predefined threshold value. Thus, the comparison quantity is an easy to understand measure for whether the noise in the (processed) input signal is dominated by a noise contribution of the device under test or by noise originating in the measurement channels.

According to another aspect of the present disclosure, the first error quantity and/or the second error quantity are/is associated with, for example, an error vector magnitude. In other words, the first error quantity and/or the second error quantity are a measure for the deviation of the amplitude and phase of the respective signal from the ideal amplitude and the ideal phase, respectively.

For example, the first complex-valued measurement signal and/or the second complex-valued measurement signal may be established as an IQ signal, respectively.

Accordingly, the first error quantity and/or the second error quantity may be a measure for the deviation of the respective complex-valued measurement signal from the corresponding ideal constellation points.

In an embodiment of the present disclosure, the signal processing circuit further comprises a visualization sub-circuit configured to generate visualization data associated with the comparison quantity. The visualization data may be displayed, for example on a display of a measurement instrument. Thus, the comparison quantity may be displayed in an illustrative way, such that a user can easily understand whether the noise in the (processed) input signal is dominated by a noise contribution of the device under test or by noise originating in the measurement channels.

In some embodiments, the visualization data comprises a color, a text message and/or a symbol indicating the value of the comparison quantity. Accordingly, different colors, text messages and/or symbols may be displayed depending on the value of the comparison quantity. Thus, it is particularly easy to understand for a user whether the noise in the (processed) input signal is dominated by a noise contribution of the device under test or by noise originating in the measurement channels.

For example, a box and/or labels having a first color, e.g., green, may be displayed if the value of the comparison quantity indicates that the noise in the (processed) input signal is dominated by a noise contribution of the device under test. A box and/or labels having a second color, e.g., red, may be displayed if the value of the comparison quantity indicates that the noise in the (processed) input signal is dominated by a noise contribution of the measurement channels.

Alternatively or additionally, a displayed measurement graph (i.e. a measurement trace) may be colored differently depending on the value of the comparison quantity. For example, the measurement graph may have a first color, e.g., green, if the value of the comparison quantity indicates that the noise in the (processed) input signal is dominated by a noise contribution of the device under test. The measurement graph may have a second color, e.g. red, if the value of the comparison quantity indicates that the noise in the (processed) input signal is dominated by a noise contribution of the measurement channels.

Alternatively or additionally, a warning symbol may be displayed if the value of the comparison quantity indicates that the noise in the (processed) input signal is dominated by a noise contribution of the measurement channels.

In some embodiments, the visualization data may comprise the first error quantity, the second error quantity, and/or the combined error quantity. Thus, the first error quantity, the second error quantity, and/or the combined error quantity may be displayed together with the visualization of the value of the comparison quantity. Thus, all information relevant for the user for assessing the individual noise contributions is displayed simultaneously.

According to an aspect of the present disclosure, the visualization data comprises, for example, values of the first error quantity, values of the second error quantity, and/or values of the combined error quantity over time. In other words, the value of the first error quantity, the value of the second error quantity, and/or the value of the combined error quantity may be displayed together over time. Thus, all information relevant for the user for assessing the individual noise contributions is displayed simultaneously in a detailed way over time.

In some embodiments, values of the first error quantity and values of the second error quantity obtained at the same time are averaged. In other words, values of the first error quantity and values of the second error quantity that are associated with the same sample of the input signal may be averaged, thereby obtaining a plurality of one-sample averages of the first error quantity and the second error quantity.

In some embodiments, the plurality of one-sample averages of the first error quantity and the second error quantity may be averaged over a predetermined number of samples, thereby obtaining a general error quantity. The analysis circuit may be configured to determine the comparison quantity based on the combined error quantity and based on the general error quantity.

Therein, the explanations regarding the comparison quantity given above likewise apply, but with the first error quantity and the second error quantity replaced by the general error quantity.

According to a further aspect of the present disclosure, the visualization data comprises, for example, values of the first error quantity, values of the second error quantity, and/or values of the combined error quantity over frequency. In other words, the value of the first error quantity, the value of the second error quantity, and/or the value of the combined error quantity may be displayed together over frequency. Thus, all information relevant for the user for assessing the individual noise contributions is displayed simultaneously in a detailed way over frequency.

In some embodiments, values of the first error quantity and values of the second error quantity obtained at the same frequency are averaged. In other words, values of the first error quantity and values of the second error quantity that are associated with the same frequency of the input signal may be averaged, thereby obtaining a plurality of one-sample averages of the first error quantity and the second error quantity.

In some embodiments, the plurality of one-sample averages of the first error quantity and the second error quantity may be averaged over a predetermined number of frequency bins, thereby obtaining a general error quantity. The analysis circuit may be configured to determine the comparison quantity based on the combined error quantity and based on the general error quantity.

Therein, the explanations regarding the comparison quantity given above likewise apply, but with the first error quantity and the second error quantity replaced by the general error quantity.

In an embodiment of the present disclosure, the analysis circuit is configured to average the first error quantity over a predetermined number of samples, thereby obtaining a first averaged error quantity. Alternatively or additionally, the analysis circuit is configured to average the second error quantity over a predetermined number of samples, thereby obtaining a second averaged error quantity. In some embodiments, the analysis circuit is configured to determine the comparison quantity based on the combined error quantity and based on the first averaged error quantity and/or the second averaged error quantity. By averaging the first error quantity and/or the second error quantity, a more reliable comparison quantity can be determined, as fluctuations average out at least partially.

Therein, the explanations regarding the comparison quantity given above likewise apply, but with the first error quantity and the second error quantity replaced by the first averaged error quantity and/or the second averaged error quantity, respectively.

In a further embodiment of the present disclosure, the analysis circuit is configured to average the first error quantity and the second error quantity over a predetermined number of samples, thereby obtaining a general error quantity. The analysis circuit is also configured to determine the comparison quantity based on the combined error quantity and based on the general error quantity. In other words, the error quantities associated with the measurement channels are merged into a single error quantity, namely the general error quantity.

By averaging the first error quantity and the second error quantity over the predetermined number of samples, a more reliable comparison quantity can be determined, as fluctuations average out at least partially.

The explanations regarding the comparison quantity given above likewise apply, but with the first error quantity and the second error quantity replaced by the general error quantity.

A further aspect of the present disclosure provides that the complex-valued average signal corresponds, for example, to a combined average of the first complex-valued measurement signal and of the complex conjugate of the second complex-valued measurement signal averaged over a predetermined number of samples. By performing this type of combined averaging, the resulting complex-valued average signal comprises significantly reduced noise from sources other than the device under test.

This is due to the fact that both the first complex-valued measurement signal and the second complex-valued measurement signal comprise noise originating from the device under test, such that these portions of the complex-valued measurement signals are correlated with each other and do not cancel out when performing the combined average.

On the other hand, noise originating from other sources, e.g., from measurement channels processing the input signal in parallel, is not correlated with each other and at least partially cancels out when performing the combined average.

If the predetermined number of samples is large enough, essentially all noise contributions originating in the measurement channels respectively cancel. Assuming that the measurement channels respectively represent the entire measurement path from an input of the measurement instrument to the analysis circuit, a measured parameter, for example an EVM, can be derived that corresponds to the "correct" parameter, namely the corresponding parameter of the DUT at the input of the measurement instrument.

According to another aspect of the present disclosure, the predetermined number of samples, for example, is adjustable. In general, increasing the predetermined number of samples leads to an enhanced noise suppression, as the non-correlated portions of the noise, i.e., the unwanted noise portions, are suppressed more the larger the number of the predetermined samples is. As the predetermined number of samples is adjustable, the analysis circuit can be adapted for different requirements, ranging from high resolution to high noise suppression.

The inventors discovered that the unwanted noise contributions can be reduced with techniques and methodologies of the present disclosure by as much as approximately by $5 \cdot \log\_10(N)$ dB or by $1\text{V}\sqrt{N}$, respectively, wherein N is the predetermined number of samples.

If the first complex-valued measurement signal and the second complex-valued measurement signal are in the frequency domain, the complex-valued average signal corresponds to a cross-correlation between the first complex-valued measurement signal and the second complex-valued measurement signal averaged over the predetermined number of samples. This is due to the fact that a multiplication of the complex-valued measurement signals in frequency domain corresponds to a convolution of the complex-valued measurement signals in time domain.

In other words, the complex-valued average signal may correspond to the trace of the cross-correlation matrix of the first complex-valued measurement signal and the second complex-valued measurement signal, divided by the predetermined number of samples.

Thus, the combined average may, colloquially, also be called a "cross correlation" of the complex-valued measurement signals.

Embodiments of the present disclosure further provide a measurement instrument, comprising any one of the signal processing circuits described above.

Regarding the advantages and further properties of the measurement instrument, reference is made to the explanations given above with respect to the signal processing circuit, which also hold for the measurement instrument and vice versa.

In some embodiments, the measurement instrument may be established as a signal analyzer, for example as a vector signal analyzer. However, it is to be understood that the measurement instrument may be established as any other suitable measurement instrument, e.g., as a spectrum analyzer, as an electromagnetic interference (EMI) test receiver, as an EMI measuring receiver, as an oscilloscope, as a digital oscilloscope, or as a power sensor.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
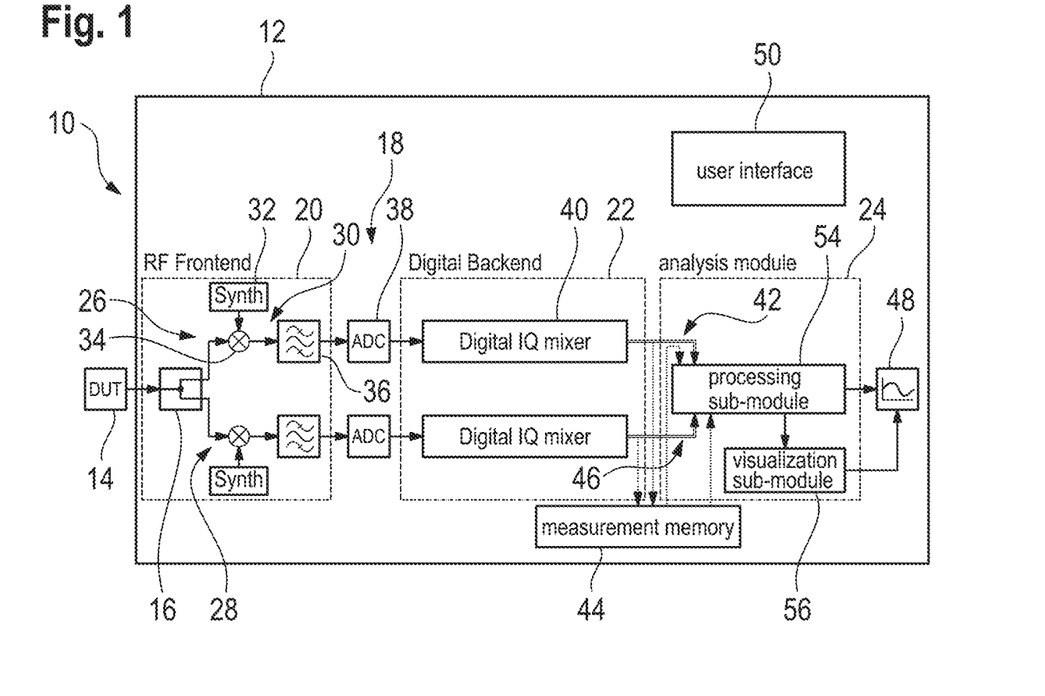
FIG. 1 schematically shows a representative measurement instrument according to an embodiment of the present disclosure.

FIG. 1 schematically shows an example of a measurement system 10 formed in accordance with an embodiment of the present disclosure. As shown in FIG. 1, the measurement system 10 comprises a measurement instrument 12 and a device under test 14. In general, the measurement instrument 12 is configured to analyze an input signal received from the device under test 14 in order to analyze certain properties of the device under test 14.

For example, the measurement instrument 12 may be a signal analyzer, a spectrum analyzer, an electromagnetic interference (EMI) test receiver, an EMI measuring receiver, an oscilloscope, a digital oscilloscope, or a power sensor. However, the measurement instrument 12 may be established as any other type of measurement instrument, depending on which aspects of the performance of the device under test 14 are to be tested.

The device under test 14 may be established as any electronic device that is configured to generate a radio-frequency (RF) signal. For example, the device under test 14 comprises one or several electronic circuits generating an RF signal, wherein the performance of the electronic circuit(s) is assessed by the measurement instrument 12.

The device under test 14 is connected to the measurement instrument 12 in a signal-transmitting manner. Therein and in the following, the term "connected in a signal transmitting manner" is understood to denote a cable-based or wireless connection that is configured to transmit signals between the respective devices or components.

For example, the device under test 14 is connected to a measurement input 16 of the measurement instrument 12 via a suitable cable and suitable connectors, such that an electric signal output by the device under test 14 is transmitted from the device under test 14 to the measurement instrument via the cable. Alternatively, the device under test 14 may transmit a wireless electromagnetic signal, which is received via an RF antenna connected to the measurement input 16. Alternatively, a measurement probe may be connected to the measurement input 16, wherein the measurement probe is configured to pick up an electric signal from the device under test 14 by contacting corresponding contact points of the device under test 14.

Still referring to FIG. 1, the measurement instrument 12 comprises a signal processing circuit 18 having an RF frontend 20, a digital backend 22, and an analysis circuit 24. The measurement instrument 12 also comprises a first measurement channel 26 and a second measurement channel 28 that are each connected to the measurement input 16.

It is noted that the measurement instrument 12 may comprise more than two measurement channels, for example four, six, eight, or more measurement channels. Without restriction of generality, the case of the measurement instrument 12 comprising two measurement channels, namely the first measurement channel 26 and the second measurement channel 28 is described in the following.

The measurement channels 26, 28 are arranged in parallel, such that an input signal received from the device under test 14 via the measurement input 16 is forwarded to and processed by both measurement channels 26, 28 in parallel. The measurement channels 26, 28 are functionally identical, i.e. the electronic components of the first measurement channel 26 are identical in construction to the electronic components of the second measurement channel 28. Thus, only the first measurement channel 26 is described in the following, as the explanations given hereinafter likewise apply to the second measurement channel 28.

The first measurement channel 26 comprises a first mixer sub-circuit 30 that is associated with the RF frontend 20 of the measurement instrument 12. In general, the first mixer sub-circuit 30 is configured to down-convert the input signal received from the device under test 14 to an intermediate frequency being suitable for processing by the electronic components downstream of the first mixer sub-circuit 30. As usual, the first mixer sub-circuit 30 comprises a local oscillator input 32 that is configured to receive a local oscillator signal.

The first mixer sub-circuit 30 further comprises a mixer circuitry 34 that is configured to mix the input signal received from the device under test 14 with the local oscillator signal, and a band-pass filter 36 that is configured to appropriately filter the resulting mixed signal in order to down-convert the input signal to the intermediate frequency.

Therein, the frequency of the local oscillator signal may be constant. Alternatively, the frequency of the local oscillator signal may be time-variant, i.e., a frequency sweep may be applied to the local oscillator signal.

The first measurement channel 26 also comprises an analog-to-digital converter (ADC) 38 that is configured to digitize the signal output by the first mixer sub-circuit 30. The first measurement channel 26 further comprises a digital IQ mixer 40 that is associated with the digital backend 22 of the measurement instrument 12.

In general, the digital IQ mixer 40 is configured to generate an IQ signal based on the digitized signal received from the ADC 38 by any suitable technique known in the art. In some embodiments, the digital IQ mixer 40 may be established as one or several field-programmable gate arrays (FPGAs) that is/are configured to generate an IQ signal based on the digitized signal received from the ADC 38. However, it is to be understood that the digital IQ mixer 40 may be established as any other suitable electronic component or group of electronic components being configured to generate the IQ signal based on the digitized signal received from the ADC 38.

It is noted that an IQ signal may be represented as a two-dimensional real vector having two components, namely the in-phase component and the quadrature component. Alternatively, the IQ signal may be represented as a complex number, wherein the in-phase component may correspond to the real part of the complex number, and the quadrature component may correspond to the imaginary part of the complex number.

Both representations are completely equivalent. Without restriction of generality, the functionality of the measurement instrument is described using the complex-valued description of the IQ signals in the following.

Summarizing, an input signal received from the device under test 14 is processed by the electronic components of the first measurement channel 26 described above, thereby generating a first complex-valued measurement signal. Likewise, the input signal received from the device under test 14 is processed by the electronic components of the second measurement channel 28, thereby generating a second complex-valued measurement signal.

In some embodiments, the two parallel measurement channels 26, 28 may be synchronized. In other words, the same portions of the input signal are processed by the two parallel measurement channels 26, 28 simultaneously.

The first complex-valued measurement signal is forwarded to a first signal input 42 of the analysis circuit 24. Alternatively or additionally, the first complex-valued measurement signal is saved in a measurement memory 44 of the measurement instrument 12.

The second complex-valued measurement signal is forwarded to a second signal input 46 of the analysis circuit 24. Alternatively or additionally, the second complex-valued measurement signal is saved in the measurement memory 44.

In general, the analysis circuit 24 is configured to apply mathematical operations to the complex-valued measurement signals in order to transform the complex-valued measurement signals into an output signal, e.g., into a measurement trace to be displayed on a display 48. It is noted that the display 48 may be integrated into the measurement instrument 12. Alternatively, the display 48 may be an external display that is connected to the measurement instrument 12.

The input signal may be received from the device under test 14 and processed by the signal processing circuit 18, for example by the analysis circuit 24 in real time. Alternatively, the input signal may be received from the device under test 14, processed by the measurement channels 26, 28 as described above, and the complex-valued measurement signals may be saved in the measurement memory 44. The saved complex-valued measurement signals may later be forwarded to the signal inputs 42, 46 for further processing by the analysis circuit 24.

The type of the mathematical operations applied to the measurement signals depends on the particular analysis mode of the analysis circuit 24. In some embodiments, the analysis circuit 24 may be switchable between different analysis modes. These different analysis modes may include but are not limited to a cross correlation mode (also called "x-corr"), a sample mode, a minimum mode, a maximum mode, an auto peak mode, an average mode, a root mean square mode, and/or an error vector magnitude (EVM) mode.

In some embodiments, for the sample mode, the minimum mode, the maximum mode, the auto peak mode, the average mode, and the root mean square mode, at least one of the complex-valued measurement signals may be converted into a real-valued measurement signal before processing by the analysis circuit 24.

For example, at least one conversion circuit may be arranged upstream of the first signal input 42 and/or upstream of the second signal input 46, wherein the at least one conversion circuit is configured to convert the first complex-valued measurement signal and/or the second complex-valued measurement signal into a real-valued measurement signal. Alternatively, the analysis circuit 24 may comprise the conversion circuitry.

In some embodiments, in the sample mode, the minimum mode, the maximum mode, the auto peak mode, the average mode, and the root mean square mode, only one of the complex-valued measurement signals may be converted into a real-valued measurement signal and processed by the analysis circuit 24. For example, a user may select one or several analysis modes to be applied to the complex-valued measurement signals via a user interface 50 of the measurement instrument 12.

Figure 2:
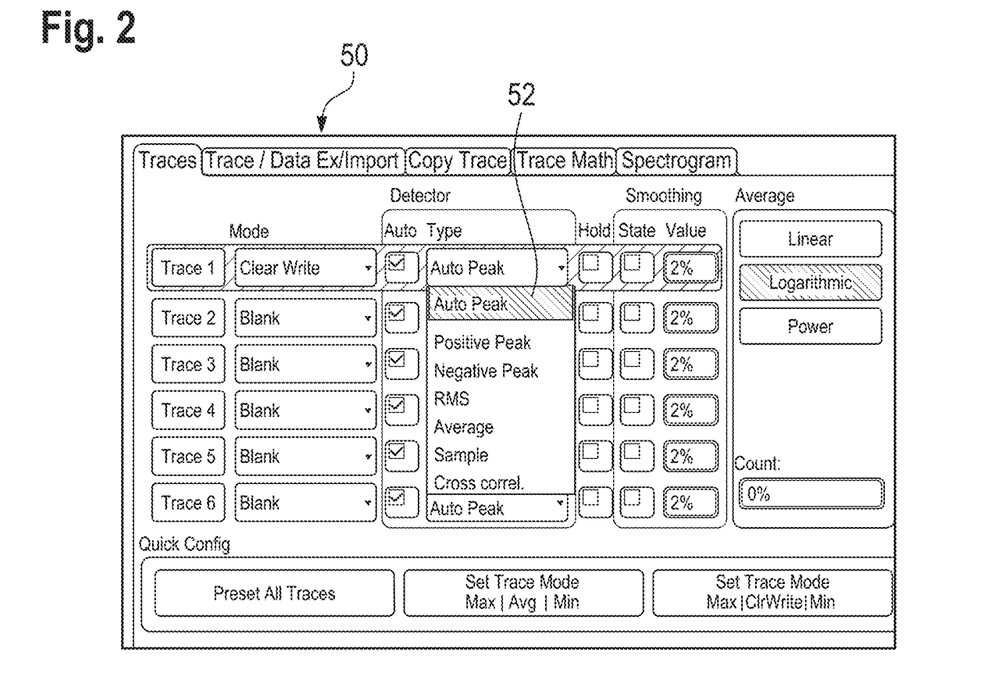
FIG. 2 schematically shows a representative user interface of the measurement instrument of FIG. 1.

FIG. 2 shows an example embodiment of the user interface 50 generated, rendered, etc., by the one or more components of the measurement instrument 12. As is illustrated in FIG. 2, the user may select the one or several analysis modes ("Trace 1" to "Trace 6" in FIG. 2)) from a drop-down menu 52. Further, the user may adjust other operational parameters of the analysis circuit 24, of the signal processing circuit 18, and/or of the measurement instrument 12 by the user interface 50. However, it is to be understood that any other type of user interface may be used.

Figure 3:
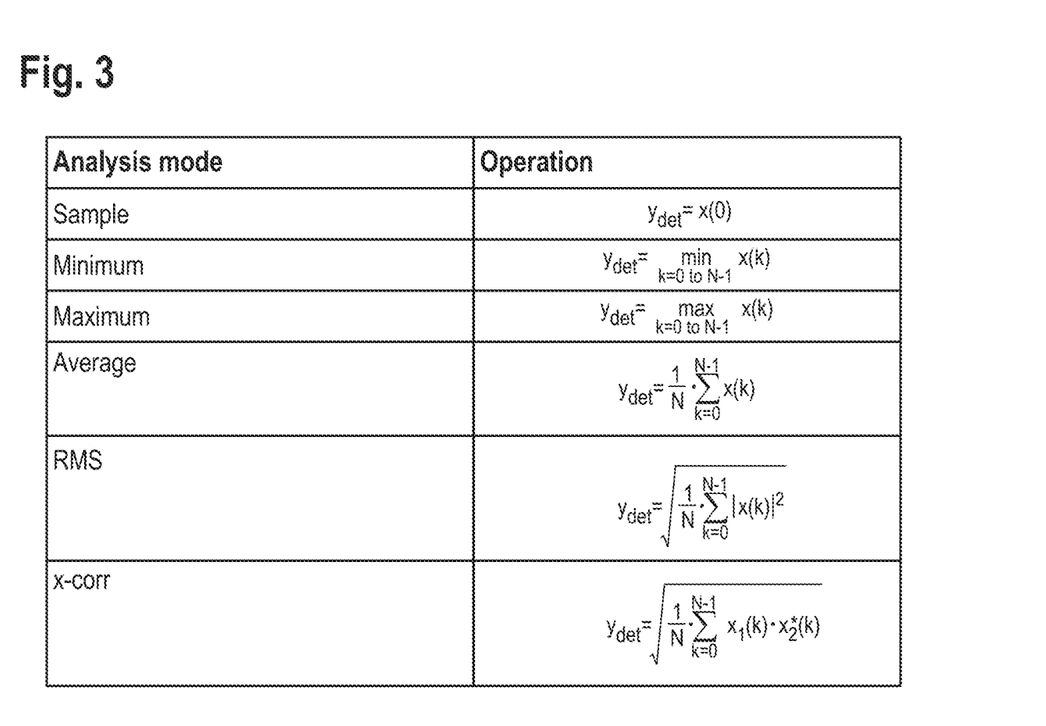
FIG. 3 shows an example of a table illustrating mathematical operations performed by a representative analysis circuit of the measurement instrument of FIG. 1.

Examples of the types of mathematical operations applied to the measurement signal(s) in the different analysis modes are illustrated in FIG. 3, which shows a table of the mathematical operations. Therein, $y_{det}$ denotes the measurement trace, while x(k) denotes the k-th sample of the respective measurement signal(s). Further, N denotes a predetermined number of samples over which the real-valued measurement signal is averaged in the average mode, and in the root mean square mode. In the last row, N denotes a predetermined number of samples over which the complex-valued measurement signals $x_1(k)$ and $x_2^*(k)$ are averaged in the cross correlation mode.

It is noted that the EVM mode corresponds to the root mean square mode applied to the respective complex-valued measurement signal, but with the individual values of the samples or rather symbols $x(k)$ replaced by $x(k)-x_{id}(k)$, wherein $x_{id}(k)$ denotes the corresponding ideal value of the respective symbol.

Figure 4:
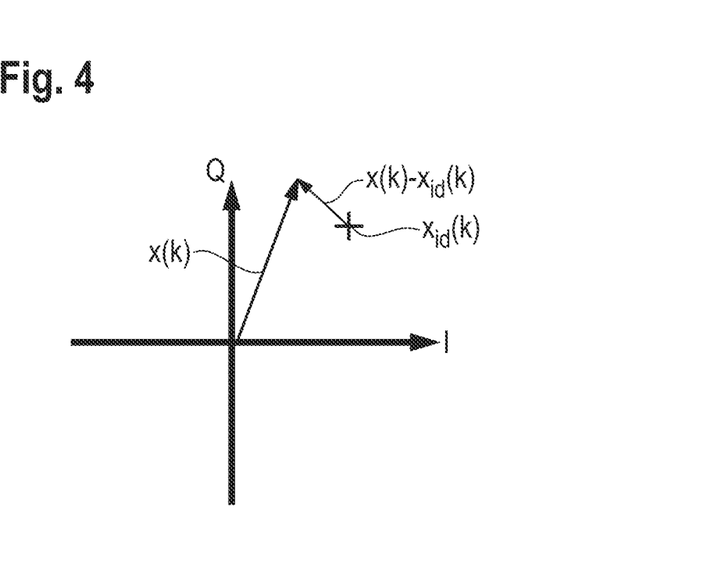
FIG. 4 shows an example of a diagram illustrating the determination of an error vector magnitude.

This is illustrated in FIG. 4, which shows a measured IQ vector $x(k)$, an ideal constellation point $x_{id}(k)$, and the corresponding error vector $x(k)-x_{id}(k)$.

Figure 5:
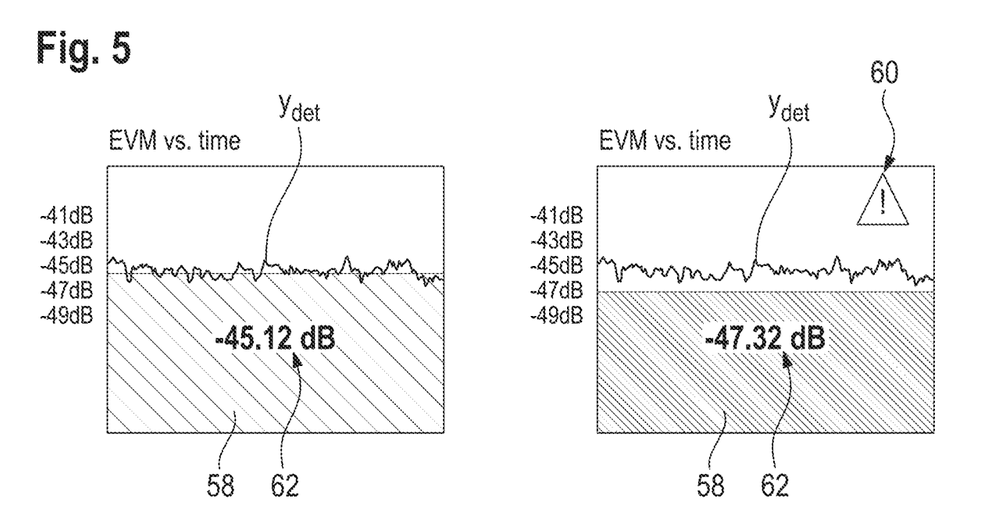
FIG. 5 shows an example of a visualization of measurement results obtained by the measurement instrument of FIG. 1.

An example of a result of a EVM determined over time is shown in FIG. 5, wherein the curve $y_{det}$ represents the determined EVM.

Measurements performed by the measurement instrument 12 are typically influenced by a noise contribution of the device under test 14 and by noise generated in the measurement channels 26. In some embodiments, if the measurement instrument 12 has an intrinsic noise level that is of the same magnitude or even higher than the noise level of the device under test 14, certain parameters of the device under test 14 cannot be reliably measured. For example, in this case the EVM determined and displayed as described above may not be reliable.

For a user of a measurement instrument 12, it is hard to tell whether the noise in a measured signal is dominated by a noise contribution of the device under test 14 or by noise originating in the measurement instrument 12. In order to alleviate this problem, the measurement instrument 12 is configured to visually indicate whether the measurements performed are trustworthy, as will be described in more detail hereinafter with reference to FIG. 1.

In some embodiments, the analysis circuit 24 comprises a processing sub-circuit 54 and a visualization sub-circuit 56. The processing sub-circuit 54 is configured to determine a first error quantity associated with the first complex-valued measurement signal.

Therein and in the following, the term "error quantity" is understood to denote a parameter that is indicative of a deviation of the respective signal value from the ideal value. For example, the term "error quantity" may denote an error vector describing the deviation of the amplitude and phase of the respective signal from the ideal amplitude and the ideal phase, respectively. As another example, the error quantity may denote a root mean square of several error vectors associated with the respective signal. As a further example, the error quantity may be an error vector magnitude, such that the error quantity describes a deviation of the constellation points of the respective IQ signal from the corresponding ideal constellation points. However, it is to be understood that the error quantities may be any other suitable error measure.

The first error quantity may be averaged over a predetermined number of samples, thereby obtaining a first averaged error quantity. Alternatively or additionally, the processing sub-circuit 54 is configured to determine a second error quantity associated with the second complex-valued measurement signal.

The second error quantity may be averaged over a predetermined number of samples, thereby obtaining a second averaged error quantity. Alternatively or additionally, the analysis circuit 24 may be configured to average the first error quantity and the second error quantity over a predetermined number of samples, thereby obtaining a general error quantity.

In other words, the error quantities associated with the first measurement channel 26 and with the second measurement channel 28 may be merged into a single error quantity, namely the general error quantity, by averaging over both the first error quantity and the second error quantity over the predetermined number of samples.

Alternatively, values of the first error quantity and values of the second error quantity obtained at the same time are averaged. In other words, values of the first error quantity and values of the second error quantity that are associated with the same sample of the input signal may be averaged, thereby obtaining a plurality of one-sample averages of the first error quantity and the second error quantity.

The plurality of one-sample averages of the first error quantity and the second error quantity may be averaged over a predetermined number of samples, thereby obtaining the general error quantity. Alternatively, values of the first error quantity and values of the second error quantity obtained at the same frequency are averaged. In other words, values of the first error quantity and values of the second error quantity that are associated with the same frequency of the input signal may be averaged, thereby obtaining a plurality of one-sample averages of the first error quantity and the second error quantity. The plurality of one-sample averages of the first error quantity and the second error quantity may be averaged over a predetermined number of frequency bins, thereby obtaining the general error quantity.

In the embodiment shown in FIG. 1, the processing sub-circuit 54 further is configured to determine a complex-valued average signal, wherein the complex-valued average signal corresponds to a combined average of the first complex-valued measurement signal and of a complex conjugate of the second complex-valued measurement signal.

The processing sub-circuit 54 may be configured to multiply the first complex-valued measurement signal $y_1(k)$ with a complex conjugate of the second complex-valued measurement signal $y_2^*(k)$, thereby obtaining a complex-valued multiplication signal $y(k)$, i.e., $$y(k)=y_1(k) \cdot y_2^*(k).$$

The processing sub-circuit 54 may further be configured average the complex-valued multiplication signal over a predetermined number of samples N, thereby obtaining the complex-valued average signal. The processing sub-circuit 54 may further be configured to determine the absolute value of the complex-valued average signal or the real part of the complex-valued average signal.

In the complex-valued average signal, noise originating in the measurement channels 26, 28 cancels at least partially, while the wanted signal (including noise) from the device under test 14 are preserved. This can be seen as follows. The complex-valued measurement signals output by the digital backend 22 can be split into a correlated part from the device under test 14 ($a$) and two uncorrelated noise parts ($n_1$ and $n_2$) from the measurement channels 26, 28:

$$y_1=a+n_1$$

$$y_2=a+n_2$$

For example, the absolute value of the complex-valued average signal (Det) then is $$Det = \left| \frac{1}{N} \cdot \sum_{i=0}^{N-1} y_{1i} \cdot y_{2i}^* \right| = \left| \frac{1}{N} \cdot \sum_{i=0}^{N-1} |a_i| + a_i \cdot n_{2i}^* + a_i^* \cdot n_{1i} + n_{1i} \cdot n_{2i}^* \right|$$

The first term, i.e. $1/N \, \Sigma |a_i|^2$, corresponds to the average power of the input signal received from the device under test 14 over time, which may correspond to the desired analysis result.

The further terms correspond to multiplications of uncorrelated signals, and thus cancel at least partially. More precisely, the further terms correspond to noise originating in the measurement channels 26, 28.

In some embodiments, it has been recognized that these unwanted noise contributions can be reduced by approximately $5 \cdot \log_{10}(N)$ dB or by $1/\sqrt{N}$, respectively.

The result for the signal Det given above corresponds to the absolute value of the complex-valued average signal.

Alternatively, the signal Det may be given by $$Det = \mathrm{Re}\left\{ \frac{1}{N} \cdot \sum_{i=0}^{N-1} y_{1i} \cdot y_{2i}^* \right\} = \mathrm{Re}\left\{ \frac{1}{N} \cdot \sum_{i=0}^{N-1} |a_i| + a_i \cdot n_{2i}^* + a_i^* \cdot n_{1i} + n_{1i} \cdot n_{2i}^* \right\}$$

As can be seen from a comparison of the two possible results for the signal Det, the two results are the same for $N \to \infty$.

In some embodiments, the predetermined number of samples N may be adjustable, e.g., via the user interface 50. The predetermined number of samples may be the same for the first error quantity, for the second error quantity, and for the complex-valued average signal. For example, the predetermined number of samples may be 10, 100, 1000, or 5000. However, the predetermined number of samples may have any other suitable value.

In some embodiments, the analysis circuit 24 or the processing sub-circuit 54 further is configured to determine a combined error quantity based on the complex-valued average signal. For example, the combined error quantity may be the absolute value of the complex-valued average signal or the real part of the complex-valued average signal described above.

In some embodiments, the analysis circuit 24 or the processing sub-circuit 54 further is configured to determine a comparison quantity based on the combined error quantity, as well as based on the first error quantity, the first averaged error quantity, the second error quantity, the second averaged error quantity, and/or the general error quantity.

In order to enhance legibility, the first error quantity, the first averaged error quantity, the second error quantity, the second averaged error quantity, and/or the general error quantity will be collectively denoted as "channel error quantity" in the following.

In general, the comparison quantity is indicative of a relative magnitude of the combined error quantity compared to the channel error quantity. For example, the comparison quantity may be value-discrete.

The comparison quantity may have a first value if the combined error quantity differs from the channel error quantity by more than the at least one predefined threshold value. In this case, the measurement channels 26, 28 contribute a significant or even dominant amount of noise.

The comparison quantity may have a second value if the combined error quantity differs from the channel error quantity by less than the at least one predefined threshold value. In this case, the measurement channels 26, 28 contribute a small or even negligible amount of noise.

For example, the value of the at least one predefined threshold value may be between 0.2 dB and 5 dB, for example between 0.5 dB and 3 dB, for example between 1 dB and 2 dB.

However, it is to be understood that a plurality of threshold values may be provided. Accordingly, the comparison quantity may be indicative of whether the combined error quantity differs from the channel error quantity by more or less than one or several of the plurality of threshold values.

The plurality of threshold values may be associated with different categories of the relative magnitude of the combined error quantity compared to the channel error quantity. The categories may, for example, be "dominated by measurement channel noise", "similar magnitude of measurement channel noise and DUT noise", and "dominated by DUT noise".

In some embodiments, the visualization sub-circuit 56 is configured to generate visualization data associated with the determined comparison quantity. In some embodiments, this visualization data or other data is displayed on the display 48.

As is illustrated in FIG. 5, the visualization data may comprise a color, a text message and/or a symbol indicating the value of the comparison quantity. In the certain example shown on the left hand side of FIG. 5, the visualization data comprises a colored box 58 having a first color, e.g., green, which is displayed if the value of the comparison quantity indicates that the noise in the (processed) input signal is dominated by a noise contribution of the device under test 14.

In the example shown on the right hand side of FIG. 5, the visualization data comprises the colored box 58 having a second color, e.g., red, which is displayed if the value of the comparison quantity indicates that the noise in the (processed) input signal is dominated by the measurement channels 26, 28.

Additionally, a warning sign 60 may be displayed, which warns a user that the noise in the (processed) input signal is dominated by the measurement channels 26, 28.

Figure 6:
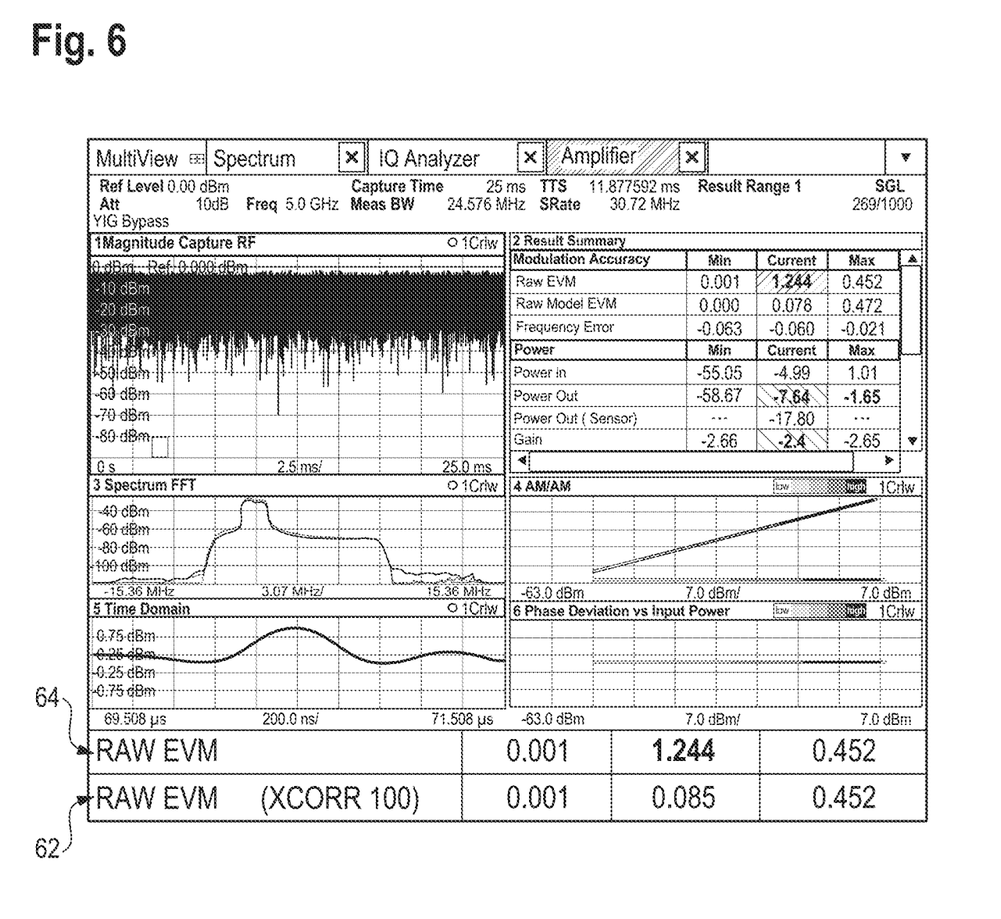
FIG. 6 shows an example of a visualization of measurement results obtained by the measurement instrument of FIG. 1.

In some embodiments, the visualization data may further comprise a text field 62 indicating the value of the combined error quantity. The text field 62 may be colored differently depending on the value of the comparison quantity. Alternatively or additionally, the displayed measurement trace $y_{det}$ may be colored differently depending on the value of the comparison quantity. As is illustrated in FIG. 6, the visualization data may further comprise a text field 62 indicating the value of the channel error quantity.

Thus, all information relevant for the user for assessing the individual noise contributions may be displayed on the display 48 simultaneously in an easy to understand and illustrative manner.

Certain embodiments disclosed herein include components, such as but not limited to the signal processing circuit 18, the analysis circuit 24, the first measurement channel 26 and/or the second measurement channel 28, the analog-to-digital converter (ADC) 38, the digital IQ mixer 40, the measurement memory 44, etc., that utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implemented the functionality described herein.

Various embodiments of the present disclosure or the functionality thereof may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably). Such non-transitory computer-readable storage media include all computer-readable media (including volatile and non-volatile media).

Embodiments of the present disclosure may also take the form of an apparatus, system, computing device, computing entity, and/or the like executing instructions stored on computer-readable storage media to perform certain steps or operations. The computer-readable media include cooperating or interconnected computer-readable media, which exist exclusively on a processing or processor system or distributed among multiple interconnected processing or processor systems that may be local to, or remote from, the processing or processor system. However, embodiments of the present disclosure may also take the form of an entirely hardware embodiment performing certain steps or operations.

Various embodiments are described above with reference to block diagrams and/or flowchart illustrations of apparatuses, methods, systems, and/or computer program instructions or program products. It should be understood that each block of any of the block diagrams and/or flowchart illustrations, respectively, or portions thereof, may be implemented in part by computer program instructions, e.g., as logical steps or operations executing on one or more computing devices. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein.

These computer program instructions may also be stored in one or more computer-readable memory or portions thereof, such as the computer-readable storage media described above, that can direct one or more computers or computing devices or other programmable data processing apparatus(es) to function in a particular manner, such that the instructions stored in the computer-readable memory produce an article of manufacture including computer-readable instructions for implementing the functionality specified in the flowchart block or blocks.

The computer program instructions may also be loaded onto one or more computers or computing devices or other programmable data processing apparatus(es) to cause a series of operational steps to be performed on the one or more computers or computing devices or other programmable data processing apparatus(es) to produce a computer-implemented process such that the instructions that execute on the one or more computers or computing devices or other programmable data processing apparatus(es) provide operations for implementing the functions specified in the flowchart block or blocks and/or carry out the methods described herein.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure.

Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A signal processing circuit for a measurement instrument, comprising:
   a measurement input configured to receive an input signal from a device under test;
   at least two parallel measurement channels connected to the measurement input such that the input signal received via the measurement input is forwarded to the two parallel measurement channels, wherein a first one of the at least two parallel measurement channels is configured to process the input signal, thereby generating a first complex-valued measurement signal, wherein a second one of the at least two parallel measurement channels is configured to process the input signal, thereby generating a second complex-valued measurement signal; and
   an analysis circuit configured to:
      determine a first error quantity associated with the first complex-valued measurement signal;
      determine a second error quantity associated with the second complex-valued measurement signal;
      determine a complex-valued average signal, wherein the complex-valued average signal corresponds to a combined average of the first complex-valued measurement signal and of a complex conjugate of the second complex-valued measurement signal;
      determine a combined error quantity based on the complex-valued average signal; and
      determine a comparison quantity based on the combined error quantity as well as based on the first error quantity and/or the second error quantity, wherein the comparison quantity is indicative of a relative magnitude of the combined error quantity compared to the first error quantity and/or the second error quantity, and wherein the comparison quantity is indicative of the amount of noise contributed by the at least two measurement channels in relation to the amount of noise contributed by the device under test,
      wherein the comparison quantity is value-discrete, wherein the comparison quantity has a first value if the combined error quantity differs from the first error quantity and/or the second error quantity by more than the at least one predefined threshold value, and wherein the comparison quantity has a second value if the combined error quantity differs from the first error quantity and/or the second error quantity by less than the at least one predefined threshold value.

2. The signal processing circuit according to claim 1, wherein the first error quantity and/or the second error quantity are/is associated with an error vector magnitude.

3. The signal processing circuit according to claim 1, wherein the signal processing circuit further comprises a visualization sub-circuit, wherein the visualization sub-circuit is configured to generate visualization data associated with the comparison quantity.

4. The signal processing circuit of claim 3, wherein the visualization data comprises a color, a text message and/or a symbol indicating the value of the comparison quantity.

5. The signal processing circuit of claim 3, wherein the visualization data comprises the first error quantity, the second error quantity, and/or the combined error quantity.

6. The signal processing circuit of claim 5, wherein the visualization data comprises values of the first error quantity, values of the second error quantity, and/or values of the combined error quantity over time, wherein values of the first error quantity and values of the second error quantity obtained at the same time are averaged.

7. The signal processing circuit of claim 5, wherein the visualization data comprises values of the first error quantity, values of the second error quantity, and/or values of the combined error quantity over frequency, wherein values of the first error quantity and values of the second error quantity obtained at the same frequency are averaged.

8. The signal processing circuit according to claim 1, wherein the analysis circuit is configured to average the first error quantity over a predetermined number of samples, thereby obtaining a first averaged error quantity, and/or wherein the analysis circuit is configured to average the second error quantity over a predetermined number of samples, thereby obtaining a second averaged error quantity, and
   wherein the analysis circuit is configured to determine the comparison quantity based on the combined error quantity and based on the first averaged error quantity and/or the second averaged error quantity.

9. The signal processing circuit according to claim 1, wherein the analysis circuit is configured to average the first error quantity and the second error quantity over a predetermined number of samples, thereby obtaining a general error quantity, and wherein the analysis circuit is configured to determine the comparison quantity based on the combined error quantity and based on the general error quantity.

10. The signal processing circuit according to claim 1, wherein the complex-valued average signal corresponds to a combined average of the first complex-valued measurement signal and of the complex conjugate of the second complex-valued measurement signal averaged over a predetermined number of samples.

11. The signal processing circuit according to claim 8, wherein the predetermined number of samples is adjustable.

12. A measurement instrument comprising a signal processing circuit, the signal processing circuit comprising:
  a measurement input configured to receive an input signal;
  at least two parallel measurement channels connected to the measurement input such that the input signal received via the measurement input is forwarded to the two parallel measurement channels, wherein a first one of the at least two parallel measurement channels is configured to process the input signal, thereby generating a first complex-valued measurement signal, wherein a second one of the at least two parallel measurement channels is configured to process the input signal, thereby generating a second complex-valued measurement signal; and
  an analysis circuit configured to:
    determine a first error quantity associated with the first complex-valued measurement signal;
    determine a second error quantity associated with the second complex-valued measurement signal;
    determine a complex-valued average signal, wherein the complex-valued average signal corresponds to a combined average of the first complex-valued measurement signal and of a complex conjugate of the second complex-valued measurement signal;
    determine a combined error quantity based on the complex-valued average signal; and
    determine a comparison quantity based on the combined error quantity as well as based on the first error quantity and/or the second error quantity, wherein the comparison quantity is indicative of a relative magnitude of the combined error quantity compared to the first error quantity and/or the second error quantity, and wherein the comparison quantity is indicative of the amount of noise contributed by the at least two measurement channels in relation to the amount of noise contributed by the device under test.

13. A signal processing circuit for a measurement instrument, comprising:
  a measurement input configured to receive an input signal;
  at least two parallel measurement channels connected to the measurement input such that the input signal received via the measurement input is forwarded to the two parallel measurement channels, wherein a first one of the at least two parallel measurement channels is configured to process the input signal, thereby generating a first complex-valued measurement signal, wherein a second one of the at least two parallel measurement channels is configured to process the input signal, thereby generating a second complex-valued measurement signal; and
  an analysis circuit configured to:
    determine a first error quantity associated with the first complex-valued measurement signal;
    determine a second error quantity associated with the second complex-valued measurement signal;
    determine a complex-valued average signal, wherein the complex-valued average signal corresponds to a combined average of the first complex-valued measurement signal and of a complex conjugate of the second complex-valued measurement signal;
    determine a combined error quantity based on the complex-valued average signal; and
    determine a comparison quantity based on the combined error quantity as well as based on the first error quantity and/or the second error quantity, wherein the comparison quantity is indicative of a relative magnitude of the combined error quantity compared to the first error quantity and/or the second error quantity, and wherein the comparison quantity is indicative of the amount of noise contributed by the at least two measurement channels in relation to the amount of noise contributed by the device under test.

* * * * *